US005745061A

United States Patent [19]
Norsworthy et al.

[11] Patent Number: 5,745,061
[45] Date of Patent: Apr. 28, 1998

[54] METHOD OF IMPROVING THE STABILITY OF A SIGMA-DELTA MODULATOR EMPLOYING DITHER

[75] Inventors: Steven Robert Norsworthy, Emmaus; David Arthur Rich, Whitehall, both of Pa.

[73] Assignee: Lucent Technologies Inc., Murray Hill, N.J.

[21] Appl. No.: 508,944

[22] Filed: Jul. 28, 1995

[51] Int. Cl.$^6$ .................................................. H03M 1/18
[52] U.S. Cl. ................................. 341/131; 341/143
[58] Field of Search .......................... 341/131, 143, 341/77, 144, 139

[56] References Cited

U.S. PATENT DOCUMENTS

| | | | |
|---|---|---|---|
| 4,751,496 | 6/1988 | Araki et al. | 340/347 AD |
| 4,857,927 | 8/1989 | Takabayashi | 341/131 |
| 5,073,777 | 12/1991 | Fukuhara | 341/131 |
| 5,144,308 | 9/1992 | Norsworthy | 341/131 |
| 5,187,481 | 2/1993 | Hiller | 341/131 |
| 5,189,418 | 2/1993 | Bartz | 341/131 |
| 5,200,750 | 4/1993 | Fushiki et al. | 341/143 |
| 5,424,739 | 6/1995 | Norsworthy | 341/143 |
| 5,451,947 | 9/1995 | Morrison | 341/131 |

OTHER PUBLICATIONS

Yoshio Yamasaki, "The Application of Large Amplitude Dither to the Quantization of Wide Range Audio Signals," *Journal of the Japan Audio Society*, vol. 39, No. 7 (1983), pp. 452–462.

Risbo, Lars, "On the Design of Tone–Free Sigma Delta Modulators," *IEEE Transactions On Circuits and Systems–II: Analog and Digital Signal Processing*, vol. 42, No. 1, Jan. 1995, pp. 52–55.

Candy, James C., and Gabor C. Temes, "Oversampling Methods for A/D and D/A Conversion," pp. 1–25.

Tewksbury, Stuart K. and Robert W. Hallock, "Oversampled, Linear Predictive and Noise–Shaping Coders of Order N>1," *IEEE Transactions On Circuits and Systems*, vol. Cas–25, No. 7, Jul. 1978, pp. 139–149.

Norsworthy, Steven R., "Optimal Nonrecursive Noise Shaping Filters For Oversampling Data Converters Part 1: Theory, Part 2: Applications".

Dunn, Chris and Mark Sandler, "A Simulated Comparison of Dithered and Chaotic Sigma–Delta Modulators," presented at the 97th Convention 1994 Nov. 10–13, AES, pp. 1–37.

Norsworthy, Steven R. and David A. Rich, "Idle Channel Tones and Dithering in Delta–Sigma Modulators," presented at the 95th Conventin 1993 Oct. 7–10, AES, New York, pp. 1–29.

*Primary Examiner*—Jeffrey A. Gaffin
*Assistant Examiner*—Peguy JeanPierre
*Attorney, Agent, or Firm*—David L. Smith

[57] ABSTRACT

Briefly, in accordance with one embodiment of the invention, a circuit comprises: a sigma-delta modulator including an input signal port, an output signal port, and a signal path. The signal path includes a feedforward signal path and a feedback signal path. The signal path is adapted to be coupled to a dither signal and the circuit is adapted to adjust the dither signal substantially in accordance with a signal applied to the input signal port. In accordance with another embodiment of the invention, a method of improving the stability of a sigma-delta modulator, the modulator employing dither, comprises the steps of: applying a signal to the input port of the sigma-delta modulator; applying a dither signal to the signal path of the sigma-delta modulator; and adjusting the dither signal applied substantially in accordance with the signal applied to the input port.

27 Claims, 4 Drawing Sheets

| LEVEL ADJUSTMENT OF DITHER | THRESHOLD LEVEL OF $|x(n)|$ (dB) | |
| --- | --- | --- |
| | BASED ON $(1 - |x(n)|^{1/4})$ | BASED ON 6 dB MULTIPLES |
| 1 | $-\infty$ | $-\infty$ |
| 1/2 | -24.08 | -36 |
| 1/4 | -10.00 | -18 |
| 1/8 | -4.64 | -6 |

METHOD OF IMPROVING THE STABILITY OF A SIGMA-DELTA MODULATOR EMPLOYING DITHER

TECHNICAL FIELD

The invention relates to sigma-delta modulators and, more particularly, to sigma-delta modulators employing dither.

BACKGROUND OF THE INVENTION

Analog-to-digital and digital-to-analog conversion, which may include oversampling or shaping the quantization noise of a digital signal, is well-known and has a wide variety of applications, including audio, telephony, and instrumentation, to name only a few. Such signal conversion is discussed, for example, in "Oversampling Methods for A/D and D/A Conversion," by James C. Candy and Gabor C. Temes, appearing in the text *Oversampling Delta-Sigma Data Converters: Theory, Design and Simulation*, edited by James C. Candy and Gabor C. Temes, and published by IEEE Press (1992); "Oversampled, Linear Predictive and Noise-Shaping Coders of Order N>1," by Stuart K. Tewksbury and Robert W. Hallock, and appearing in the aforementioned Candy and Temes text; "Optimal Nonrecursive Noise Shaping Filters for Oversampling Data Converters, Part 1: Theory" and "Optimal Nonrecursive Noise Shaping Filters for Oversampling Data Converters, Part 2: Applications," by Steven R. Norsworthy, appearing in IEEE Proc. ISCAS '93, Vol. 2, pp 1353–1360, May 1993; "Idle Channel Tones and Dithering in Delta-Sigma Modulators," by Steven R. Norsworthy and David A. Rich, presented at the 95th Convention of the Audio Engineering Society, Oct. 7–10, 1993; "On the Design of Tone-Free $\Sigma\Delta$ Modulators," by L. Risbo, appearing in IEEE Transc. on Circuits and Systems—II: Analog and Digital Signal Processing, Vol. 42, No. 1, January 1995; and "A Simulated Comparison of Dithered and Chaotic Sigma-Delta Modulators," by C. Dunn and M. Sandler, presented at the 97th Convention of the Audio Engineering Society, Nov. 10–13, 1994, all of the foregoing being herein incorporated by reference.

U.S. Pat. No. 5,144,308, entitled "Idle Channel Tone and Periodic Noise Suppression for Sigma-Delta Modulators Using High-Level Dither," by Steven R. Norsworthy, issued Sep. 1, 1992, assigned to the assignee of the present invention and herein incorporated by reference, discloses a technique for using a digitally generated dither signal to improve the performance of a sigma-delta modulator by reducing the amount of periodic noise and spurious tones generated in the modulator output signal. However, employing a dither signal to improve the performance of a sigma-delta modulator in this respect may also reduce the dynamic range of the sigma-delta modulator. Thus, a need exists for a technique of employing dither to reduce idle channel tones without substantially degrading or reducing the dynamic range of the sigma-delta modulator.

SUMMARY OF THE INVENTION

Briefly, in accordance with one embodiment of the invention, a circuit comprises: a sigma-delta modulator including an input signal port, an output signal port, and a signal path. The signal path includes a feedforward signal path and a feedback signal path. The signal path is adapted to be coupled to a dither signal and the circuit is adapted to adjust the dither signal substantially in accordance with a signal applied to the input signal port.

Briefly, in accordance with another embodiment of the invention, a method of improving the stability of a sigma-delta modulator, the modulator employing dither, comprises the steps of: applying a signal to the input port of the sigma-delta modulator; applying a dither signal to the signal path of the sigma-delta modulator; and adjusting the dither signal applied substantially in accordance with the signal applied to the input port.

BRIEF DESCRIPTION OF THE DRAWING

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

Figure 1:
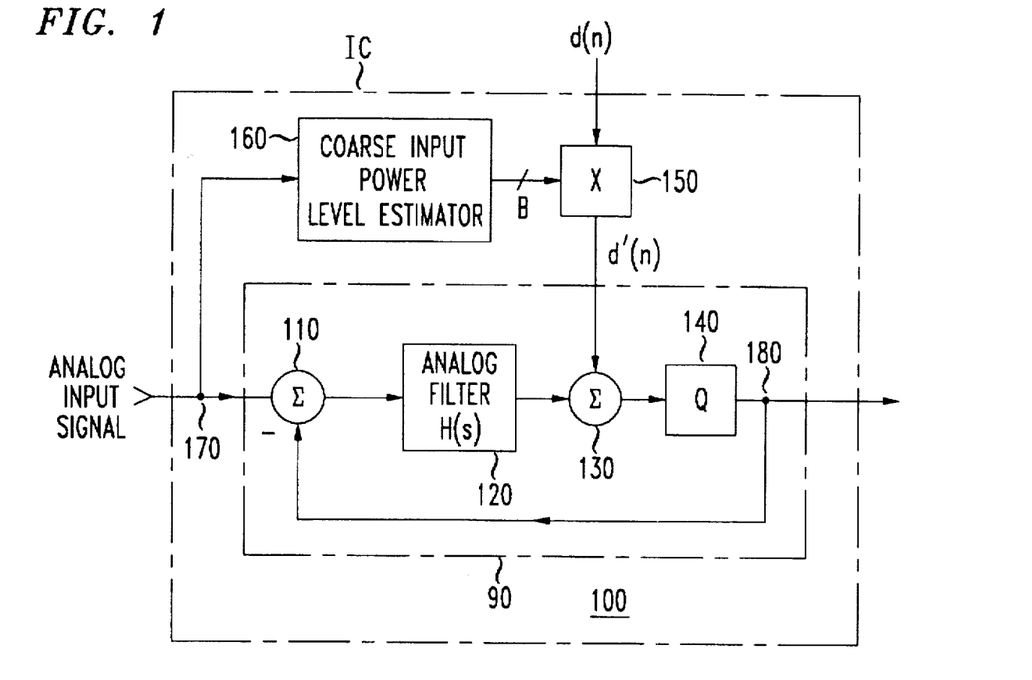
FIG. 1 is a block diagram illustrating an embodiment of a sigma-delta modulator in accordance with the invention that may employ a method of improving the stability of a sigma-delta modulator employing dither in accordance with the invention.
Figure 2:
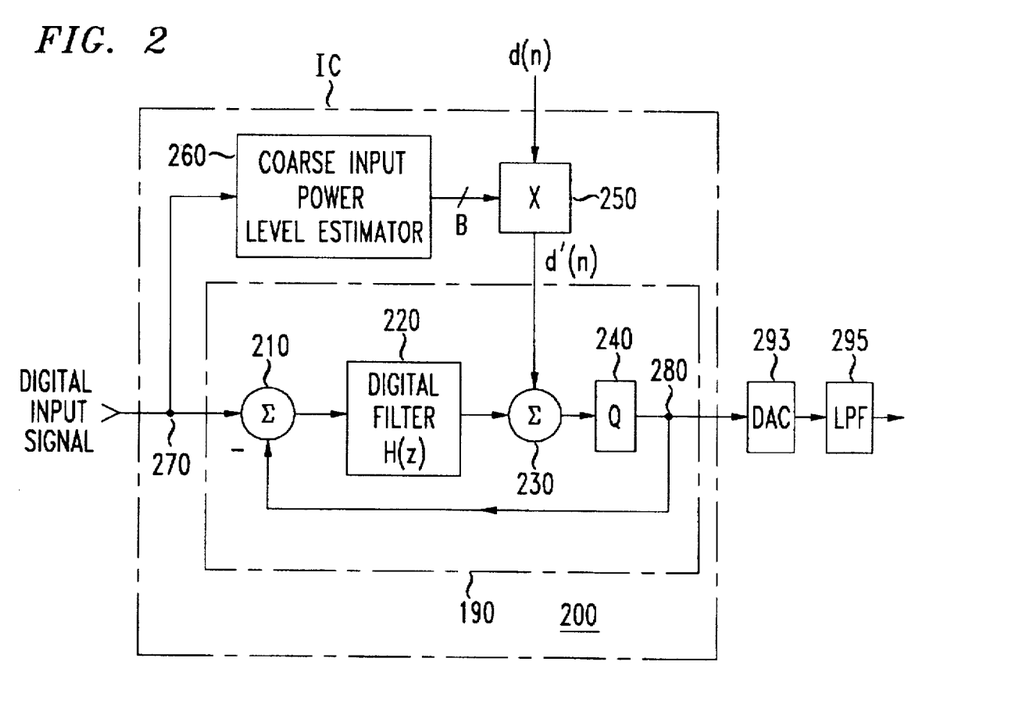
FIG. 2 is a block diagram illustrating an alternative embodiment of a sigma-delta modulator in accordance with the invention that may employ a method of improving the stability of a sigma-delta modulator employing dither in accordance with the invention.

FIG. 1 illustrates an embodiment 100 of a sigma-delta modulator in accordance with the invention. Likewise, the embodiment illustrated may employ a method of improving the stability of a sigma-delta modulator employing dither in accordance with the invention. As illustrated, embodiment 100 comprises a sigma-delta modulator 90, although the invention is not limited in scope to this particular sigma-delta modulator. In this context, the term "sigma-delta modulator" refers to a circuit or device for spectrally shaping quantization error associated with the use of a quantizer so that at least a portion of the quantization error occurs outside the frequency band of interest through coarse quantization, feedback, and filtering. Oversampling may also be employed. Thus, the sigma-delta modulator employed may comprise a sigma-delta modulator of any number of bits, such as a one-bit sigma-delta modulator or a multi-bit sigma-delta modulator. For example, for a one-bit sigma-delta modulator, quantizer 140 comprises a one-bit quantizer. Likewise, the sigma-delta modulator employed may have any order filter in its feedback signal path, it feedforward signal path, or both, and in addition, may have multiple feedforward loops, multiple feedback loops, or both. Furthermore, the sigma-delta modulator employed may be multi-staged or cascaded. Thus, in general, depending on the particular application, any embodiment of a sigma-delta modulator will suffice in which at least a portion of the in-band quantization noise of the sigma-delta modulator is reduced at the expense of a portion of the out-of-band quantization noise. Likewise, although the embodiment of a sigma-delta modulator illustrated in FIG. 1 is employed to perform analog-to-digital conversion, the invention is not limited in scope in this respect. For example, the sigma-delta modulator used may be employed to perform digital-to-analog conversion, such as illustrated by the embodiment of FIG. 2, and, likewise, "digital-to-digital" conversion, such as, "requantization" may, likewise, be performed. Furthermore, it will be appreciated that the terms delta-sigma modulator and sigma-delta modulator are generally used interchangeably in this context.

As illustrated, the embodiment of a sigma-delta modulator shown in FIG. 1 includes an input signal port 170 and an output signal port 180. Likewise, the embodiment includes a signal path having a feedforward signal path, comprising a summing node 110, an analog signal filter 120, a summing node 130, and a quantizer 140, and a feedback signal path, from output port 180 to summing node 110. Of course, analog signal filter 120 may be implemented as a continuous time or sampled data filter, such as a switched capacitor implementation, for example. Filter 120 of FIG. 1 illustrates a continuous time analog signal filter. Likewise, in this particular embodiment, the feedforward signal path of the sigma-delta modulator is adapted to be coupled to a circuit or device providing a dither signal, such as at summing node 130 in this particular embodiment. Nonetheless, it will, of course, be appreciated that the invention is not limited in scope to being adapted to having a dither signal introduced at this particular point in the signal path. A dither signal may be applied to a sigma-delta modulator at any point in the signal path so long as the dither signal is appropriately compensated, such as by pre-filtering, depending upon the particular coupling point selected, as explained in more detail in aforementioned U.S. Pat. No. 5,144,308. Likewise, the dither signal is illustrated as being externally-derived, e.g., FIG. 1 illustrates embodiment 100 on an integrated circuit and the circuit or device producing the dither signal is illustrated as "off-chip;" however, the invention is not limited in scope in this respect. In fact, in many applications, the dither signal may be provided "on-chip."

As illustrated in FIG. 1, embodiment 100 is adapted to adjust the dither signal substantially in accordance with a signal applied to the input signal port, in this particular embodiment an analog input signal. As illustrated in FIG. 1, the analog input signal is also provided to a coarse input power level estimator 160 which provides an input signal to multiplier 150, in this embodiment. Thus, a coarse estimate of the substantially instantaneous input power is produced by estimator 160 and applied to modulate or adjust the dither signal, such as by multiplier 150. In this particular embodiment, the dither signal is provided to the other port of multiplier 150 in a manner so as to adjust the instantaneous power of the dither signal that is ultimately applied to the signal path of the sigma-delta modulator substantially in accordance with the coarse estimate obtained for the substantially instantaneous input power. It will now be appreciated, nonetheless, that many approaches may be employed to obtain a coarse estimate of the substantially instantaneous input power and the invention is not limited in scope to any particular approach. For example, currents, voltages or other electrical parameters related to power may be measured to obtain a coarse estimate. Likewise, based at least in part on the nature of sigma-delta modulators, it may be possible to obtain a coarse estimate of the substantially instantaneous power of the input signal based on measurements taken other than at the input signal port.

In this particular embodiment, the dither signal may be generated digitally using a pseudorandom number generator, although the invention is not limited in scope in this respect. For example, alternatively, an analog dither signal may be generated by an analog noise generator. Likewise, in this embodiment, the signal provided to multiplier 150 by coarse estimator 160 is likewise digital. Thus, multiplier 150 produces a digital output signal. Of course, if an analog dither signal were generated, an analog multiplier may be used if estimator 160 also produces an analog signal. Although not explicitly illustrated in FIG. 1, the digital output signal produced by multiplier 150 may be provided to a digital-to-analog converter so that the modified dither signal, d'(n) in this particular embodiment, may be appropriately superpositioned with the signal provided along the feedforward signal path of the sigma-delta modulator via filter 120. Likewise, the digital output signal of quantizer 140 may be provided to a digital-to-analog converter so that it may be superpositioned with the input signal at node 110, although these conventional aspects of a sigma-delta modulator embodiment are not specifically illustrated.

As previously indicated, it is now known to be desirable to dither a sigma-delta modulator to reduce the tonal behavior of the quantization error of the output signal. This is described in the aforementioned U.S. Pat No. 5,144,308, by Norsworthy, entitled "Idle Channel Tone And Periodic Noise Suppression For Sigma-Delta Modulators Using High Level Dither." However, one problem with applying a dither signal to a sigma-delta modulator is that the noise floor of the sigma-delta modulator may increase by several decibels. This may occur at least in part due to the closed feedback loop structure and coarse quantization of a sigma-delta modulator. Due to the superposition of the dither signal with the signal provided along the signal path of the sigma-delta modulator, such as described in U.S. Pat. No. 5,144,308, a power level may be reached at which the sigma-delta modulator becomes unstable. Instability in the context of sigma-delta modulators may be manifested as an exponential rise in quantization error and frequently occurs at amplitudes approaching full scale. Likewise, for sigma-delta modulators of order greater than two, this may also lead to unrecoverable limit cycle operation. See, for example, "A Simulated Comparison of Dithered and Chaotic Sigma-Delta Modulators," by Chris Dunn and Mark Sandler, presented at the 97th Convention of the Audio Engineering Society (AES), held Nov. 10–13, 1995, at San Francisco, Calif., available as an AES preprint, and herein incorporated by reference. The ultimate effect of this unstable behavior may be to reduce the dynamic range of the sigma-delta modulator, particularly in comparison with a sigma-delta modulator in which no dither signal is applied. One advantage of a method of improving the stability of a sigma-delta modulator employing dither in accordance with the invention includes having the capability to reduce, therefore, the tonal behavior of the quantization error produced by a sigma-delta modulator, while also substantially maintaining an adequate dynamic range of the sigma-delta modulator.

Figure 3:
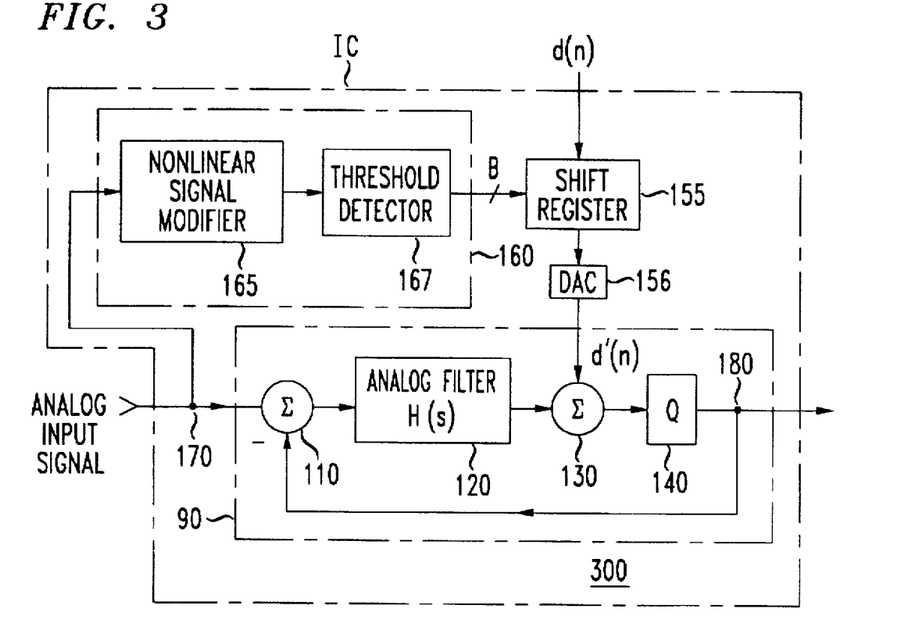
FIG. 3 is a block diagram illustrating yet another embodiment of a sigma-delta modulator in accordance with the invention that may employ a method of improving the stability of a sigma-delta modulator employing dither in accordance with the invention.

FIG. 3 illustrates an embodiment 300 of a sigma-delta modulator in accordance with the invention. This particular embodiment is similar to the embodiment illustrated in FIG. 1 with some additional features. As illustrated, embodiment 300 includes a quantizer 140, an analog filter 120 and summing nodes, such as 110 and 130. However, as illustrated in FIG. 3, in this particular embodiment multiplier 150 is implemented as a shift register 155 and is followed by a digital-to-analog converter (DAC) 156. Thus, as illustrated, the dither signal provided to shift register 155 is divided by powers of two. The powers of two to be applied to the dither signal are determined, at least in part, by the signal provided by coarse estimator 160 in this particular embodiment. Likewise, in this particular embodiment, coarse estimator 160 is illustrated as a nonlinear signal modifier 165 and a $2^B$-level threshold detector 167, where B is a positive integer indicating the number of bits provided to shift register 155.

Signal modifier 165 and threshold detector 167 may be implemented in a variety of ways. For example, signal modifier 165 may comprise a full-wave rectifier for rectifying the analog signal provided via a coupling from tap 170 or an expander. Alternatively, a suitable square law device, such as a two quadrant square law device, may be employed. For example, in one implementation, a MOSFET circuit may be used. Other embodiments of a signal modifier may likewise be employed. As illustrated, signal modifier 165 is provided in order to receive the analog signal as an input signal and provide an output signal that may be roughly correlated with the substantially instantaneous power of the analog signal provided. This output signal may then be provided to $2^B$-level threshold detector 167. Threshold detector 167 may be implemented, for example, as a B-bit flash A/D converter. Threshold detector 167 determines the appropriate threshold signal level out of a plurality of selected threshold signal levels for the signal provided by signal modifier 165 and in response provides a binary digital signal, in this particular embodiment, having B-bits. In a relatively simple implementation, threshold detector 167 may have a single selected or predetermined threshold signal level and provide a single bit indicating whether the signal provided by signal modifier 165 is below the predetermined threshold level or above the predetermined threshold level. Alternatively, as described, threshold detector 167 may realize a plurality of selected threshold signal levels and, depending upon the relationship of the level of the signal provided by signal modifier 165 to the selected threshold signal levels, threshold detector 167 may provide a binary digital signal output. Together signal modifier 165 and threshold detector 167 comprise, in this particular embodiment, a coarse input power level estimator, although the invention is, of course, not limited in scope in this respect. Depending upon the coarse estimate of the substantially instantaneous power of the analog signal provided, a different binary digital signal may be provided to an arithmetic shift register 155. Likewise, the greater the coarse estimate of the substantially instantaneous power of the analog signal detected by the coarse estimator, the greater attenuation may be applied to the dither signal via shift register 155. In this particular embodiment, this is implemented by shifting a binary digital dither signal in accordance with the binary digital signal provided to shift register 155 by the coarse estimator. For example, if the signal provided is a 1-bit signal in an embodiment in which B is 1, the dither signal may be shifted by 1-bit, although the invention is not limited in scope in this respect. In this particular embodiment, this is mathematically equivalent to multiplication or division up to $2^B$, depending on the direction and amount of the digital signal shifting and on the signal provided to threshold detector 167. Ultimately, modulated or modified dither signal, d'(n), is applied to the signal path of the sigma-delta modulator (after it has been converted to an analog signal), as illustrated in FIG. 3.

Figure 6:
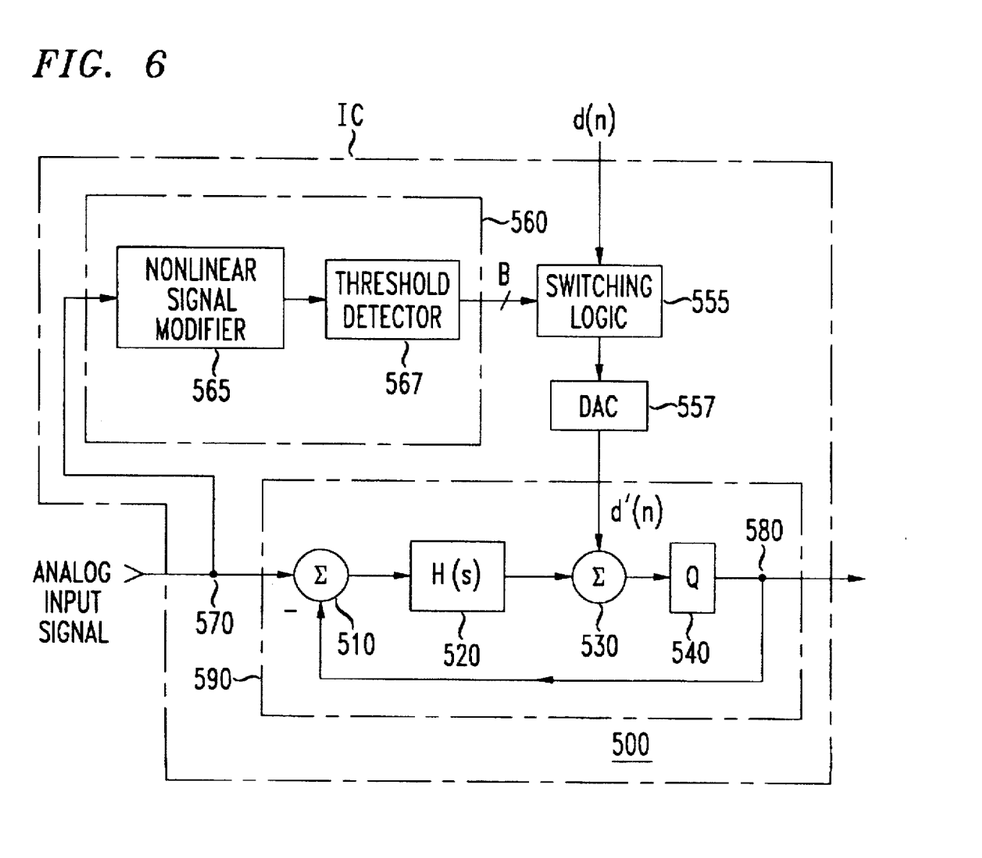
FIG. 6 is a block diagram illustrating still one more embodiment of a sigma-delta modulator in accordance with the invention that may employ a method of improving the stability of a sigma-delta modulator employing dither in accordance with the invention.
Figure 7:
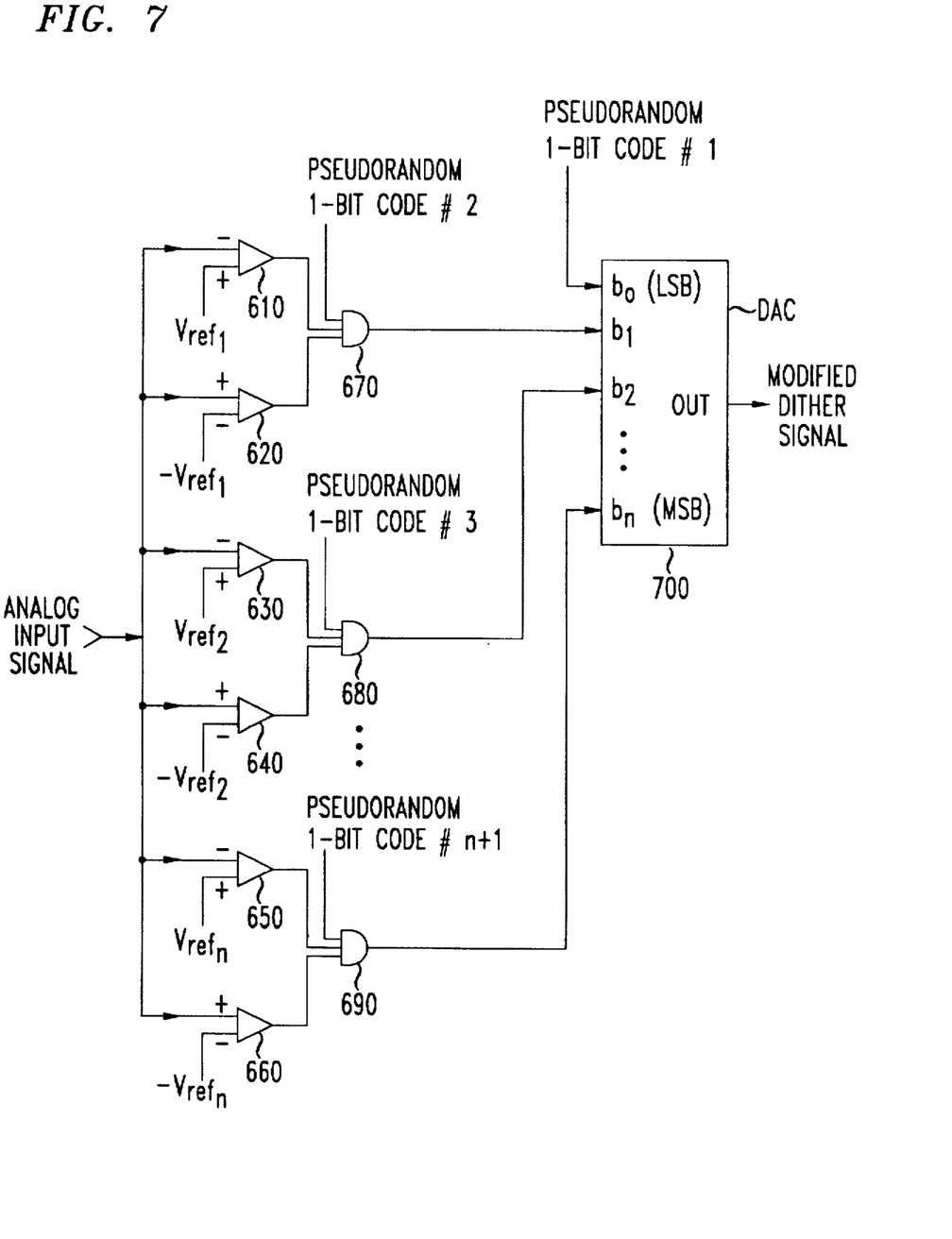
FIG. 7 is a schematic diagram illustrating a portion of even yet another embodiment of a sigma-delta modulator in accordance with the invention that may employ a method of improving the stability of a sigma-delta modulator employing dither in accordance with the invention.

In yet another alternative embodiment, as illustrated in FIG. 6, instead of a shift register, a switching circuit 555 may be employed. In alternative embodiments, such as discussed below in connection with FIG. 7, signal modifier 565 may be eliminated by employing a threshold detector for bipolar signals. In this particular embodiment, a D-to-A converter (DAC) 557 is explicitly illustrated. The B-bits provided via coarse estimator 560 in this embodiment may be employed to affect the value of the analog signal produced by DAC 557 in accordance with the switching logic. A particular implementation is discussed below with reference to FIG. 7. Again, the invention is not limited in scope to this particular embodiment. A variety of alternative embodiments are possible.

For the embodiment illustrated in FIG. 6, a nonlinear signal modifier 565 is illustrated. For example, a full-wave rectifier or an expander may be employed. One advantage of a full-wave rectifier is that it removes the need to detect both positive and negative signal levels, such as for a voltage input signal. For the portion of the embodiment illustrated in FIG. 7, a full-wave rectifier is not employed, so therefore, alternatively, positive and negative signal level detection, or thresholding, is illustrated. An expander, although not illustrated, may also be employed so as to reduce the effect of signal offsets in comparators that may be employed in the threshold detector, such as the comparators illustrated in FIG. 7. For the implementation of FIG. 7, the dither signal may be provided by a digital random or pseudorandom number generator (not shown). Thus, random or pseudorandom 1-bit codes are provided as illustrated. As illustrated, the analog input signal is provided to comparators, such as 610, 620, 630, 640, 650, and 660, that together operate as a multilevel threshold detector, such as, for example, detector 567 shown in FIG. 6. A threshold detector output signal is provided to switching logic, such as gates 670, 680, and 690. Thus, the switching logic or circuit in effect obtains a coarse estimate of the input power level from the threshold detector. The digital signal provided by the threshold detector may be modified or adjusted by the switching logic such that the digital dither signal provided to the D-to-A converter, such as DAC 700 in FIG. 7, will be reduced in amplitude as the analog input signal increases. DAC 700 generates a modified or modulated dither signal in analog form that is provided to the sigma-delta modulator. Of course, the output signal of the DAC may be provided in a variety of forms, such as current, voltage, or charge. The threshold levels are not restricted to binary levels and may be selected to be any convenient arbitrary level, as indicated by the voltage references in FIG. 7, for example. Likewise, the coding of the DAC may be employed so as to nonlinearly modify the dither signal in response to the input signal. Of course, the number of quantization levels may be reduced to simplify the DAC employed. Likewise, it may be desirable to introduce hysteresis into the comparators to reduce the incidence of oscillations at the output port of the comparator.

FIG. 2 illustrates yet another embodiment 200 of a sigma-delta modulator in accordance with the invention. In contrast with the embodiment illustrated in FIG. 1, in this particular embodiment, digital-to-analog conversion is performed. As illustrated, this particular embodiment includes a digital filter 220, summing nodes 210 and 230, a quantizer 240, a multiplier 250 and a coarse input power level estimator 260. Likewise, (DAC) 293 and low-pass filter (LPF) 295 are coupled to the output port of sigma-delta modulator 190. This particular embodiment operates in a manner like the embodiment illustrated in FIG. 1, although the signal provided to coarse estimator 260 in this embodiment is a digital signal rather than an analog signal. Likewise, the modified dither signal provided to sigma-delta modulator 190, in this particular embodiment, is a digital signal whereas for the embodiment illustrated in FIG. 1, digital-to-analog conversion is employed. It will be understood that in this context in which conversion between analog and digital systems is employed, the power of a digital signal refers to the relative scale of the digital signal and is based at least in part on an equivalent analog signal or an analog system providing an analog signal.

Figure 4:
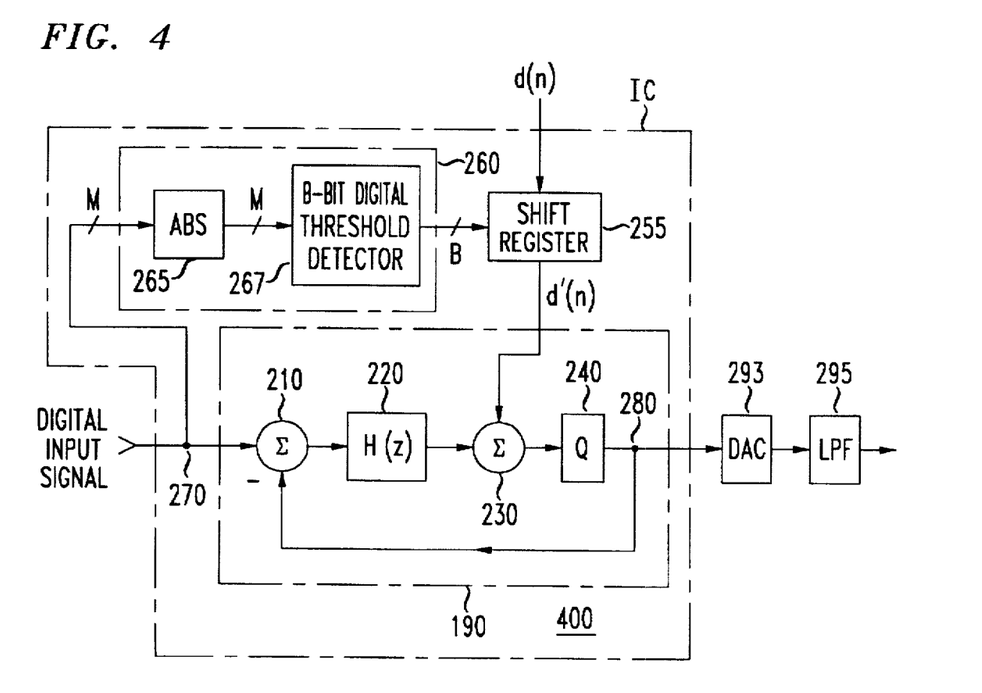
FIG. 4 is a block diagram illustrating still another embodiment of a sigma-delta modulator in accordance with the invention that may employ a method of improving the stability of a sigma-delta modulator employing dither in accordance with the invention.

FIG. 4 illustrates still yet another embodiment of a sigma-delta modulator in accordance with the invention. The embodiment illustrated in FIG. 4 is similar to the embodiment shown in FIG. 2 with some additional features. For example, multiplier 250 of FIG. 2 is implemented as a shift register 255, like the embodiment illustrated in FIG. 3. Likewise, coarse estimator 260 is illustrated in greater detail in this particular embodiment, although the scope of the invention is, of course, not limited in this respect. In this particular embodiment, the digital input signal is illustrated as an M-bit signal provided to coarse estimator 260. Likewise, the M-bit signal is provided to a binary digital circuit 265, which produces the absolute value of the digital input signal provided to the circuit. Thus, the M-bit signal is complemented if the signal provided represents a signal having a magnitude below zero, whereas the signal is not complemented otherwise. This may be conventionally implemented using digital logic based at least in part on the sign bit of the M-bit digital signal. A "twos complement" implementation may be employed, for example, although the invention is not limited in scope in this respect. Next, the resulting M-bit digital signal is provided to a B-bit digital threshold detector 267. In this particular embodiment, threshold detector 267 "requantizes" the M-bits obtained as an input signal and provides B-bits as an output signal, where B is less than M and B and M are positive integers. It will, of course, now be appreciated that the predetermined threshold levels are not limited to binary levels, as will be explained in more detail hereinafter. Likewise, as previously described, threshold detector 267 may comprise a single level threshold detector. The remaining portion of embodiment 400 illustrated in FIG. 4 with respect to shift register 255 operates in a similar manner to the embodiment described in FIG. 3. Likewise, although not illustrated in FIG. 4, a masking register may be included, for example if the digital input signal comprises N-bits, whereas only M-bits are needed for coarse estimator 260, M being less than N and N being a positive integer. The masking register may mask those bits of the digital input signal that are not needed by the coarse estimator to perform its operation.

A sigma-delta modulator in accordance with the invention, such as the embodiment illustrated in FIG. 1, may use a method of improving the stability of a sigma-delta modulator employing dither in accordance with the invention. First, a signal may be applied to the input port of the sigma-delta modulator, such as input port 170 illustrated in FIG. 1. Likewise, a dither signal may be applied to the signal path of the sigma-delta modulator, such as at summing node 130. The dither signal applied may be adjusted substantially in accordance with the signal applied to the input port. This is illustrated in FIG. 1 in which the power of the dither signal applied is adjusted by providing a signal to multiplier 150 that provides a coarse estimate of the substantially instantaneous power of the input signal. Likewise, coarse estimator 160 has as its input signal, the analog input signal applied to the sigma-delta modulator.

Although, as may now be appreciated by one skilled in the art, reducing or attenuating the power of the dither signal, such as by reducing its amplitude, may have a detrimental effect on the reduction of the tonal behavior of the quantization error, nonetheless, the quantization error is typically most tonal and correlated with the input signal when the input signal has a relatively small amplitude, indicating relatively low power. Typically, the quantization error spectrum becomes increasingly smooth and less correlated for larger input signal levels, indicating greater power. Furthermore, quantization errors tend to be perceptually masked by the human ear when the input signal level is above the quantization error. Thus, the dither signal may be reduced as the input signal increases without a substantial degradation in the reduction of the tonal behavior of the quantization error.

The potential instability of the sigma-delta modulator may occur substantially instantaneously. Thus, substantially instantaneous dynamic modulation of the dither signal based at least in part on the input signal is desirable. In one particular embodiment, a pseudorandom dither signal, d(n), may be modulated by the magnitude of the input signal, x(n), applied to input port 170 in a manner that substantially produces the peak dither signal as the input signal approaches zero, and a substantially zero dither signal as the input signal approaches a normalized peak, while continually diminishing the power or amplitude of the dither signal as the instantaneous power of the input signal increases from zero to the normalized peak. Although the scope of the invention is not restricted in this respect, one example of a type of amplitude modulation, for example, that may achieve this result is provided by equation (1) below:

$$d'(n) = d(n) \cdot (1 - abs[x(n)]^{6\alpha}) \quad 0 < \alpha \leq 1 \tag{1}$$

where $\alpha$ is an exponential parameter used for attenuating the dither signal with an increasing input signal and "abs" refers to the absolute value of the argument. It will, of course, now be appreciated by one skilled in the art that a trade-off exists in selecting an appropriate value of $\alpha$. If $\alpha$ is too small, not enough power or amplitude in the dither signal may be present to remove tones for low input signal amplitudes. If $\alpha$ is too large, the benefits of reducing the instability of the sigma-delta modulator are diminished for relatively high input signal amplitudes. Likewise, it may be illustrated that modulating the dither signal in the manner previously described will be essentially inaudible for most practical situations.

Figure 5:
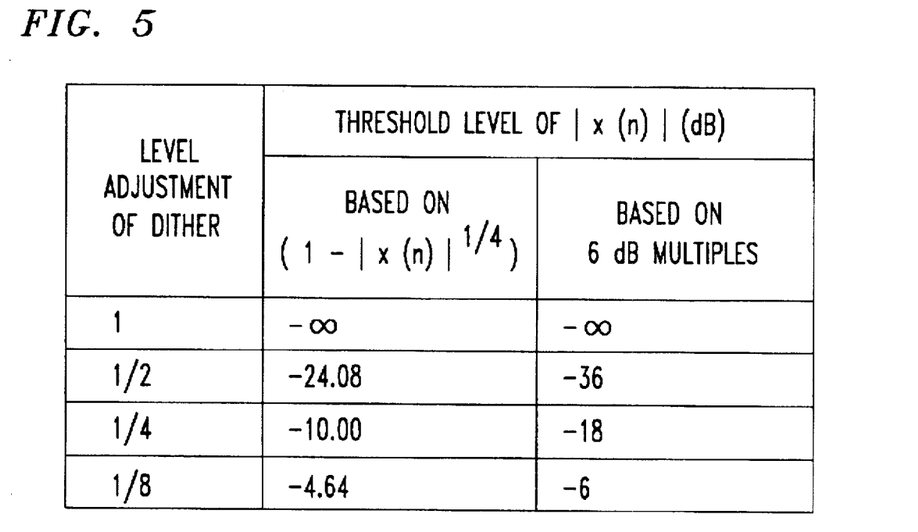
FIG. 5 is a table illustrating threshold levels and quantization values for an embodiment of a method of improving the stability of a sigma-delta modulator employing dither in accordance with the invention.

A number of techniques may be employed to reduce the complexity of a particular implementation, although the invention is not limited in scope to these particular techniques. For example, it may desirable to quantize the modulation factor of the dither signal to a few discrete levels, such as by factors of two. For example, for amplitude modulation in accordance with equation (1) above, it may be desirable to determine the input signal amplitude values which result in successive factor of two decreases for the modulation factor, where unity corresponds to essentially no input signal amplitude. FIG. 5 is a table illustrating one such example, although, of course, the invention is not limited in scope in this respect. The threshold values in the table are given in decibels rather than in terms of absolute amplitudes. The example illustrates a 2-bit quantization of the modulation factor. Thus, the selected thresholds may be employed in a shift register implementation to reduce the amplitude of the dither signal by factors of two.

For the first column shown in FIG. 5 the first threshold occurs when the input signal is approximately −24 dB full scale. In some circumstances it may be desirable to adjust this threshold to a smaller value, such as −30 to −40 dB, in order to modulate the dither signal at a lower input signal level. However, a trade-off exists in selecting this threshold level because it may not be desirable for the sigma-delta modulator to have a low dither signal for relatively low input signals, as previously described. A number of approaches may be employed to select desired threshold values. For example, for the threshold values illustrated in the second column of FIG. 5, the threshold values were selected in order to make the signal-to-noise ratio curve approximately follow the desired curve resulting from continuous unquantized dither level adjustment. Using the values in the second column of the table in FIG. 5 as a starting point and iteratively performing simulations, the threshold values in the third column were obtained. Simulation indicates that the selection of particular threshold values is relatively robust. Therefore, satisfactory performance may be achieved by adjusting the threshold levels by several decibels in either direction. Thus, it may be desirable to select convenient threshold values for a particular implementation due to the robust nature of the performance. For example, for the threshold values illustrated in the third column of the table in FIG. 5, the values are spaced by 6 dB increments. Likewise, additional simplifications may be employed to reduce the number of threshold levels. Thus, for example, three or two threshold levels may be employed and, likewise, as previously indicated only a few bits of a quantized dither signal may also be employed for reduced hardware complexity.

While only certain features of the invention have been illustrated and described herein, many modifications, substitutions, chances or equivalents will now occur to those skilled in the art. It is, therefore, to be understood that the appended claims are intended to cover all such modifications and changes as fall within the true spirit of the invention.

The invention claimed is:

1. A circuit comprising:
    a sigma-delta modulator including an input signal port, an output signal port and a signal path, said signal path including a feed-forward signal path and a feedback signal path,
    said signal path coupled so as to receive a dither signal, and
    said circuit being adapted to adjust the dither signal substantially in accordance with the power of a signal applied to the input signal port as determined by a nonlinear signal modifier.

2. The circuit of claim 1,
    wherein said circuit is further adapted to adjust the power of the dither signal substantially in accordance with an estimate of the power of the signal applied to the input signal port.

3. The circuit of claim 2,
    wherein said circuit is further adapted to adjust the power of the dither signal substantially in accordance with a coarse estimate of the substantially instantaneous power of the signal applied to the input signal port.

4. The circuit of claim 1,
    wherein said circuit is further adapted to adjust the amplitude of the dither signal substantially in accordance with an estimate of the amplitude of a signal applied to the input signal port.

5. The circuit of claim 4,
    wherein said circuit is further adapted to attenuate the amplitude of the dither signal substantially in accordance with an estimate of the amplitude of a signal applied to the input signal port.

6. The circuit of claim 4,
    wherein said circuit is further adapted to attenuate the amplitude of the dither signal substantially in accordance with a coarse estimate of the amplitude of a signal applied to the input signal port.

7. The circuit of claim 4, further comprising
    an arithmetic shift register for adjusting the amplitude of the dither signal.

8. The circuit of claim 1,
    wherein said circuit is adapted to adjust the dither signal is incorporated in an analog-to-digital converter.

9. The circuit of claim 1,
    wherein said circuit is adapted to adjust the dither signal is incorporated in a digital-to-analog converter.

10. The circuit of claim 1,
    wherein said circuit is adapted to adjust the dither signal is incorporated in a digital-to-digital requantizer.

11. The circuit of claim 1,
    wherein said sigma-delta modulator comprises a one-bit sigma-delta modulator.

12. The circuit of claim 1,
    wherein said sigma-delta modulator comprises a sigma-delta modulator having an order greater than two.

13. The circuit of claim 1,
    said circuit comprising switching logic;
    the dither signal comprising a plurality of pseudorandom 1-bit codes;
    said circuit being adapted to adjust the dither signal with said switching logic by adjusting the number of 1-bit codes in accordance with a signal applied to the input signal port.

14. The circuit of claim 1, further comprising a threshold detector for coarsely estimating the amplitude of the signal applied to the input port.

15. A method of improving the stability of a sigma-delta modulator employing dither comprising the steps of:
    applying a signal to the input port of the sigma-delta modulator;
    applying a dither signal to the signal path of the sigma-delta modulator; and
    adjusting the dither signal applied substantially in accordance with a nonlinear modification of the power of the signal applied to the input port.

16. The method of claim 15,
    wherein the step of adjusting the dither signal comprises adjusting the power of the dither signal applied substantially in accordance with an estimate of the substantially instantaneous power of the signal applied to the input port.

17. The method of claim 15,
    wherein the step of adjusting the power of the dither signal includes estimating the power of the input signal.

18. The method of claim 15,
    wherein the step of adjusting the power of the dither signal applied comprises adjusting the power of the dither signal applied substantially in accordance with a coarse estimate of the instantaneous power of the signal applied to the input signal port.

19. The method of claim 15,
wherein the step of adjusting the dither signal comprises adjusting the amplitude of the dither signal substantially in accordance with the amplitude of the signal applied to the input port.

20. The method of claim 19,
wherein the step of adjusting the amplitude of the dither signal includes estimating the amplitude of the input signal.

21. The method of claim 20,
wherein the step of estimating the amplitude of the input signal comprises coarsely estimating the amplitude of the input signal.

22. The method of claim 19,
wherein the step of adjusting the dither signal comprises attenuating the dither signal substantially in accordance with the amplitude of the signal applied to the input port.

23. The method of claim 15,
wherein the sigma-delta modulator comprises a one-bit sigma-delta modulator.

24. The method of claim 15,
wherein the sigma-delta modulator comprises a sigma-delta modulator having an order greater than two.

25. The method of claim 15,
wherein the step of applying a dither signal comprises applying the dither signal to the signal path of the sigma-delta modulator at a substantially predetermined point.

26. A circuit comprising:

a sigma-delta modulator including an input signal port, an output signal port and a signal path, said signal path including a feedforward signal path and a feedback signal path, said signal path coupled so as to receive a dither signal, wherein said circuit is further adapted to attenuate the amplitude of the dither signal substantially in accordance with a coarse estimate of the amplitude of a signal applied to the input signal port, a nonlinear signal modifier coupled to a threshold detector for coarsely estimating the amplitude of the signal applied to the input port.

27. A circuit comprising:

a sigma-delta modulator including an input signal port, an output signal port and a signal path, said signal path including a feedforward signal path and a feedback signal path, said signal path coupled so as to receive a dither signal, wherein the dither signal comprises a plurality of pseudo-random 1-bit codes, said circuit further comprising switching logic, said circuit being adapted to adjust the dither signal with said switching logic by adjusting the number of 1-bit codes in accordance with the signal applied to the input signal port.

* * * * *